US010062825B2

(12) United States Patent
Wong et al.

(10) Patent No.: US 10,062,825 B2
(45) Date of Patent: Aug. 28, 2018

(54) THERMO-ELECTRIC GENERATOR MODULE

(75) Inventors: Joseph Chung-Kai Wong, Hong Kong (CN); Roy A. L. Vellaisamy, Hong Kong (CN); Andrew Y. T. Leung, Hong Kong (CN)

(73) Assignee: CITY UNIVERSITY OF HONG KONG, Kowloon (HK)

( * ) Notice: Subject to any disclaimer, the term of this patent is extended or adjusted under 35 U.S.C. 154(b) by 0 days.

(21) Appl. No.: 13/535,556

(22) Filed: Jun. 28, 2012

(65) Prior Publication Data
US 2014/0000669 A1 Jan. 2, 2014

(51) Int. Cl.
*H01L 35/30* (2006.01)

(52) U.S. Cl.
CPC .................... *H01L 35/30* (2013.01)

(58) Field of Classification Search
CPC .................... H01L 35/32; H01L 35/34
USPC ........................ 136/205, 201, 224
See application file for complete search history.

(56) References Cited

U.S. PATENT DOCUMENTS

| 4,191,593 | A | * | 3/1980 | Cacheux | H01L 31/0725 |
| | | | | | 136/246 |
| 4,313,024 | A | * | 1/1982 | Horne | F24J 2/07 |
| | | | | | 136/246 |
| 4,370,615 | A | * | 1/1983 | Whistler | G01R 1/30 |
| | | | | | 324/441 |
| 4,522,193 | A | * | 6/1985 | Bates | 126/634 |
| 2008/0163916 | A1 | * | 7/2008 | Tsuneoka et al. | 136/203 |
| 2009/0133734 | A1 | * | 5/2009 | Takahashi | 136/230 |
| 2009/0229647 | A1 | * | 9/2009 | Iversen | C22C 12/00 |
| | | | | | 136/201 |
| 2009/0277490 | A1 | * | 11/2009 | Chu | 136/230 |
| 2010/0011565 | A1 | * | 1/2010 | Zawadzki | B23K 26/0876 |
| | | | | | 29/592.1 |
| 2011/0186956 | A1 | * | 8/2011 | Hiroshige et al. | 257/467 |
| 2011/0247678 | A1 | * | 10/2011 | Fan | H01L 31/042 |
| | | | | | 136/246 |

(Continued)

FOREIGN PATENT DOCUMENTS

| CN | 201277082 Y | 7/2009 |
| CN | 102487259 A | 6/2012 |

(Continued)

OTHER PUBLICATIONS

Adjacent—Definition, "Definition of adjacent", Merriam-Webster, [online], [retrieved on Feb. 26, 2014]. Retrieved from the Internet:<URL: http://www.merriam-webster.com/dictionary/adjacent>, pp. 1-4.*

(Continued)

*Primary Examiner* — Tae-Sik Kang
(74) *Attorney, Agent, or Firm* — Amin, Turocy & Watson, LLP

(57) ABSTRACT

Described herein are a thermo-electric generator module and a method for constructing the thermo-electric generator module. The thermo-electric generator module includes a plurality of thermo-electric plates on a surface of a heat absorption member; and a heat dissipation region that encases the heat absorption member. The thermo-electric module is connected in series with other thermo-electric generator modules to facilitate generation of electricity.

16 Claims, 7 Drawing Sheets

(56) References Cited

U.S. PATENT DOCUMENTS

| | | | | |
|---|---|---|---|---|
| 2012/0153240 A1* | 6/2012 | Luo | ........................ | B82Y 30/00 |
| | | | | 252/519.4 |
| 2012/0199171 A1* | 8/2012 | Watts | ............................. | 136/205 |
| 2013/0167893 A1* | 7/2013 | Nishino | .................. | C22C 38/06 |
| | | | | 136/201 |
| 2014/0224295 A1* | 8/2014 | Yazawa | ...................... | F24J 2/42 |
| | | | | 136/206 |

FOREIGN PATENT DOCUMENTS

| | | | | |
|---|---|---|---|---|
| CN | 102510240 A | 6/2012 | | |
| CN | 102245688 B | 3/2014 | | |
| WO | WO 2010116162 A2 * | 10/2010 | | |
| WO | WO 2012033116 A1 * | 3/2012 | ............. | C22C 38/06 |
| WO | WO 2013049724 A1 * | 4/2013 | ................. | F24J 2/42 |

OTHER PUBLICATIONS

Hendricks, et al.,"Engineering Scoping Study of Thermoelectric Generator Systems for Industrial Waste Heat Recovery". Pacific Northwest National Laboratory, Nov. 2006, pp. 1-74. http://www1.eere.energy.gov/manufacturing/industries_technologies/imf/pdfs/teg_final_report_13.pdf. Last accessed Sep. 25, 2012.

* cited by examiner

THERMO-ELECTRIC GENERATOR MODULE

TECHNICAL FIELD

This disclosure generally relates to a thermo-electric generator module that facilitates efficient power generation.

BACKGROUND

Thermo-electric materials offer a promising solid-state solution for clean energy applications. Thermo-electric generators (or thermogenerators) employ thermo-electric materials to convert heat energy directly into electrical energy using the thermoelectric effect. Thermo-electric generators are less expensive in construction than conventional solar panels for harvesting an equivalent amount of energy. However, thermo-electric generators have not made a significant impact on large-scale energy generation other than in niche applications due to lack of an efficient, inexpensive thermo-electric modular design.

The above-described background is merely intended to provide an overview of contextual information regarding thermo-electric generators, and is not intended to be exhaustive. Additional context may become apparent upon review of one or more of the various non-limiting embodiments of the following detailed description.

SUMMARY

The following presents a simplified summary of the specification in order to provide a basic understanding of some aspects of the specification. This summary is not an extensive overview of the specification. It is intended to neither identify key or critical elements of the specification nor delineate any scope of particular embodiments of the specification, or any scope of the claims. Its sole purpose is to present some concepts of the specification in a simplified form as a prelude to the more detailed description that is presented later.

In accordance with one or more embodiments and corresponding disclosure, various non-limiting aspects are described in connection with a thermo-electric generator module. In an embodiment, a thermo-electric generator module is described. The thermo-electric generator module includes a plurality of thermo-electric plates on a surface of a heat absorption member. The thermo-electric generator module also includes a heat dissipation region that encases the heat absorption member.

According to another embodiment, a method for constructing a thermo-electric generator module is described. The method includes installing a plurality of thermo-electric plates on a surface of a heat absorption member. The method also includes inserting the heat absorption member and the plurality of thermo-electric plates into a heat dissipation casing.

In a further embodiment, a thermo-electric series is described. The thermo-electric series includes a plurality of thermo-electric modules connected in series. At least one of the plurality of thermo-electric modules in the thermo-electric series comprises: a heat absorption member; a plurality of thermo-electric plates on a surface of the heat absorption member; and a heat dissipation region that encases the heat absorption member.

The following description and the drawings set forth certain illustrative aspects of the specification. These aspects are indicative, however, of but a few of the various ways in which the various embodiments of the specification may be employed. Other aspects of the specification will become apparent from the following detailed description of the specification when considered in conjunction with the drawings.

BRIEF DESCRIPTION OF THE DRAWINGS

Numerous aspects and embodiments are set forth in the following detailed description, taken in conjunction with the accompanying drawings, in which like reference characters refer to like parts throughout, and in which.

DETAILED DESCRIPTION

Figure 1:
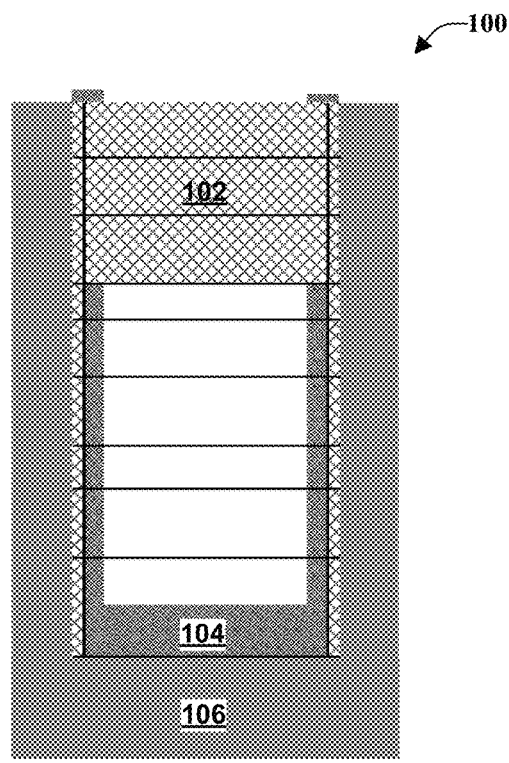
FIG. 1 is a schematic illustration of an example thermo-electric generator module, according to a non-limiting embodiment.

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that the certain aspects of disclosure may be practiced without these specific details, or with other methods, components, molecules, etc. In other instances, well-known structures and devices are shown in block diagram form to facilitate description and illustration of the various embodiments.

In accordance with one or more embodiments, described herein is an efficient, inexpensive thermo-electric generator module. The thermo-electric generator module generates electric power efficiently in a limited space. Referring now to the drawings, with reference initially to FIG. 1, illustrated is an example non-limiting thermo-electric generator module 100. The thermo-electric generator module 100 includes a plurality of thermo-electric plates 102 on a surface of a heat absorption member 104. The thermo-electric generator module 100 also includes a heat dissipation region 106 that encases the heat absorption member 104.

Figure 2:
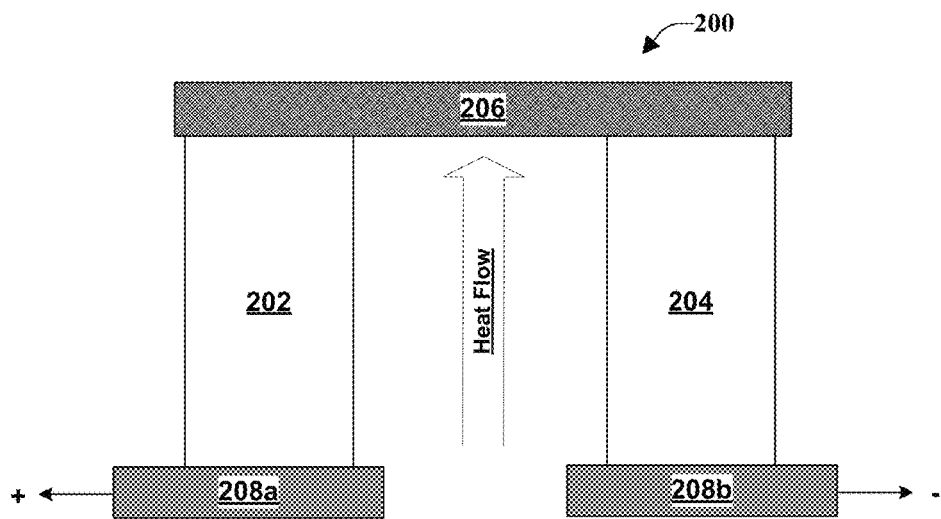
FIG. 2 is a schematic illustration of an example thermo-electric generator that can be utilized within a thermo-electric generator module, according to a non-limiting embodiment.

As illustrated in FIG. 2, a thermo-electric generator 200 includes a thermocouple of an n-type material 202 and a p-type material 204 connected electrically in series and thermally in parallel. The thermo-electric power generation can be based on the Seebeck effect: heat is input to a hot junction 206 and rejected by a cold junction defined by elements 208a, 208b and a voltage is generated across the n-type and p-type thermocouple materials 202, 204.

The thermo-electric generator module 100 of FIG. 1 operates similarly to the thermo-electric generator 200 of FIG. 2. The heat dissipation region 106 operates as the cold junction defined by elements 208a and 208b; the heat absorption member 104 operates as the hot junction 206; and the plurality of thermo-electric plates 102 operate as thermocouples, each of the plurality of thermo-electric plates 102 has an n-type material 202 and a p-type material 204 connected electrically in series and thermally in parallel.

The heat dissipation region 106 can be a heat dissipation casing made from at least one heat dissipation material that facilitates the dissipation of heat (and creation of the cold junction defined by elements 208a and 208b). The heat absorption member 104 can be made from at least one heat absorption material that facilitates the absorption of heat (and creation of the hot junction 206).

One or more thermo-electric plates 102 can be located on each surface of the heat absorption member 104 (e.g., if the heat absorption member 104 has four surfaces, one or more thermo-electric plates 102 are located on each of the four surfaces). The thermo-electric generator module 100, according to an embodiment, includes an array of thermo-electric plates 102 located on one or more surfaces of the absorption member 104. The array of thermo-electric plates 102 can facilitate the generation of electric energy. In an embodiment, the array of thermo-electric plates 102 can include forty or more thermo-electric plates 102.

At least one of the plurality of thermo-electric plates 102 is made of a "good" thermo-electric material. While all materials have a non-zero thermo-electric effect, such as the Seebeck effect (generation of electric energy in response to temperature difference), the Peltier effect (generating heat energy in response to an applied current), and/or the Thompson effect (heating/cooling a conductor with a temperature gradient), the thermo-electric effect of most materials is often too small to be useful in applications, such as thermo-electric generators. A "good" thermo-electric material is a material that has: at least a pre-defined electrical conductivity, e.g., a relatively high electrical conductivity, to maintain low, e.g., to minimize, resistive Joule heating (a rise in temperature from resistance to electric current flowing through the thermo-electric material), at least a pre-defined Seebeck coefficient for high, e.g., maximum, conversion of heat to electrical power (or maximum electrical power to cooling performance), and/or at most a pre-defined thermal conductivity, e.g., a relatively low thermal conductivity, to prevent thermal conduction through the material.

The electrical conductivity, the Seebeck coefficient and the thermal conductivity are commonly combined into a single metric, the figure of merit (Z). Z is defined as:

$$Z = \sigma S^2 / \lambda,$$

where S is the Seebeck coefficient of the material (Volt/Kelvin), $\lambda$ is thermal conductivity (Watt/(meter*Kelvin)), and $\sigma$ is electrical conductivity (Ampere/(Volt*meter)). Since Z has a unit of Kelvin$^{-1}$, a more useful dimensionless figure-of-merit (Z*T) is defined to evaluate the performance of a thermo-electric behavior of a material. T is the average operating temperature in units of Kelvin.

Efficiency of the material, such as maximum power conversion efficiency or maximum refrigeration coefficient of performance, is proportional to ZT. Efficiency is maximized or near maximum when the material has a large Z at a high temperature, T. Although there is no known limit to Z, in practice, it has been difficult to achieve high ZT values because of the inherent coupling of electrical conductivity and thermal conductivity in most materials. In materials with a large Z, the electrical conductivity, $\sigma$, is high, minimizing resistive Joule heating, and/or the thermal conductivity, $\lambda$, is low, maintaining a large temperature gradient between the heat dissipation region 106 and the heat absorption member 104.

Examples of "good" thermo-electric materials that can be used in at least one of the thermo-electric plates 102 include: $Bi_aTe_b$, $Co_cSb_d$, $Zn_xSb_y$, $Bi_ePb_fTe_g$, and the like. It will be understood that a, b, c, d, x, y, e, f and g can be any number, bound only by the rules for conservation of charge.

In an embodiment, $Zn_xSb_y$ is an example of a "good" thermo-electric material at least due to its low thermal conductivity, $\lambda$. Additionally, $Zn_xSb_y$ is also easier to produce and cheaper than other thermo-electric materials. Compared to other thermo-electric materials, Zn and Sb are more abundant in nature, and have proven to be economical candidates for thermo-electric applications.

In an embodiment, a material including Zn and Sb is the thermo-electric material utilized by at least one of the plurality of thermo-electric plates 102 of thermo-electric generator module 100. An example of a material including Zn and Sb is binary $Zn_xSb_y$ phase. The binary $Zn_xSb_y$ phase has a very low thermal conductivity, $\lambda$, and, consequently, a high Z.

In another embodiment, the thermo-electric material utilized by the at least one of the plurality of thermo-electric plates 102 of thermo-electric generator module 100 is a doped $Zn_xSb_y$. $Zn_xSb_y$ can be doped with one or more materials, including Pb, Si, Ca, and La.

In further embodiment, a nanomaterial based on $Zn_xSb_y$ doped with one or more of Pb, Si, Ca, and La is the thermo-electric material utilized by the at least one of the plurality of thermo-electric plates 102 of thermo-electric generator module 100. A thermo-electric nanomaterial based on $Zn_xSb_y$ doped with one or more of Pb, Si, Ca, and La is cost effective compared with expensive commercialized thermo-electrical materials, such as BiTe, SiGe, and the like.

The heat absorption member 104 helps to establish the temperature gradient in the thermo-electric generator module 100 between the heat absorption member 104 and the heat dissipation region 106. To facilitate establishment of the temperature gradient, the heat absorption member 104 has a shape sufficient to trap heat and/or light without allowing the heat and/or light to reflect out from the heat absorption member 104.

According to an embodiment, the heat absorption member 104 includes a cavity. According to an embodiment, the cavity is a U-shaped chamber, which facilitates confinement of the heat and/or light. In another embodiment, the U-shaped chamber has a neck at an opening (for example at the top) with a shape that substantially prevents heat and/or light from escaping through the opening of the chamber.

Trapping heat and/or light within the chamber facilitates radiation of heat energy through the thermo-electric generator for conversion to electric energy. The cavity can have any shape that facilitates confinement of the heat energy within the cavity and/or facilitates radiation of heat energy through the thermo-electric generator for conversion to electric energy. Example shapes of the cavity include a U shape, a gourd shape, and the like.

Figure 3:
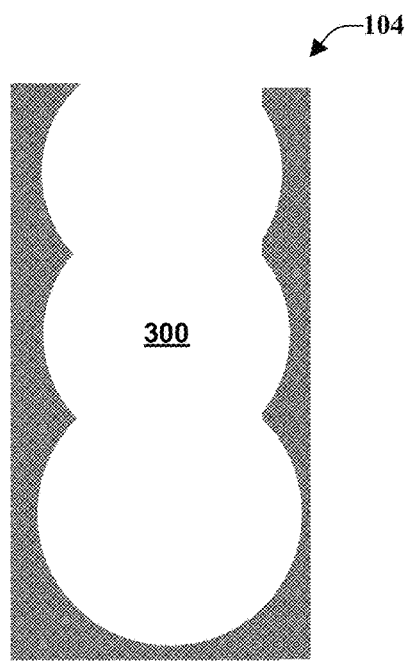
FIG. 3 is a schematic illustration of an example cavity of a heat absorption member, according to a non-limiting embodiment.

A gourd-shaped cavity 300 is shown in FIG. 3. The gourd-shaped cavity 300 helps to trap heat and/or light within the heat absorption region 104. In other words, the gourd-shaped cavity facilitates confinement of heat energy within the gourd-shaped cavity 300. By confining heat energy within the gourd-shaped cavity 300, the gourd-shaped cavity 300 reduces heat loss in thermo-electric generator module 100. By reducing heat loss, the gourd-shaped cavity 300 facilitates radiation of heat energy only through the thermo-electric generator module 100 for energy conversion, which increases efficiency of the thermo-electric generator module 100.

As an example, non-limiting, cost data point, compared to current commercial thermo-electrical generators, the thermo-electrical generator module 100 can lower the cost of energy generation from about $5000-about $7000 per kilowatt to about $450-$500 per kilowatt. The thermo-electric generator module 100 can achieve an efficiency of greater than or equal to about five percent. In an embodiment, the thermo-electric generator module 100 can achieve an efficiency of greater than about five percent.

Figure 4:
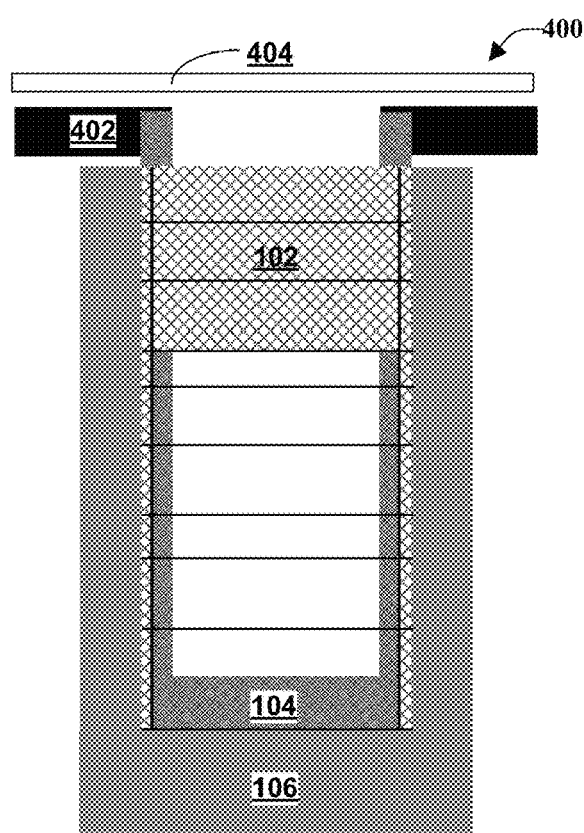
FIG. 4 is a schematic illustration of a power recovery rod, according to a non-limiting embodiment.

Referring now to FIG. 4, illustrated is an example power recovery rod 400, according to a non-limiting embodiment. The power-recovery rod 400 is a hermetically sealed thermo-electric module that facilitates generation of electric power cheaply and efficiently. For example, the total cost of energy generation by power-recovery rode 400 is less than about $1/Watt.

The power recovery rod 400 includes a plurality of thermo-electric plates 102 on a surface of a heat absorption member 104. The power recovery rod 400 also includes a heat dissipation region 106 that encases the heat absorption member 104.

The heat dissipation region 106 is a heat dissipation casing made from at least one heat dissipation material that facilitates the dissipation of heat. The heat absorption member 104 is made from at least one heat absorption material that facilitates the absorption of heat.

One or more thermo-electric plates 102 can be located on each surface of the heat absorption member 104 (e.g., if the heat absorption member 104 has four surfaces, one or more thermo-electric plates 102 are located in each of the four surfaces). The power-recovery rod 400, according to an embodiment, includes an array of thermoelectric plates 102 located on one or more surfaces of the absorption member 104. The array of thermo-electric plates 102 can facilitate the generation of electric energy. In an embodiment, the array of thermo-electric plates 102 can include forty or more thermo-electric plates 102.

At least one of the plurality of thermo-electric plates 102 includes a "good" thermo-electric material. Examples of "good" thermo-electric materials that can be used in at least one of the thermo-electric plates 102 include: $Bi_aTe_b$, $Co_cSb_d$, $Zn_xSb_y$, $Bi_ePb_fTe_g$, and the like. It will be understood that a, b, c, d, x, y, e, f and g can be any number, bound only by the rules for conservation of charge.

According to an embodiment, the "good" thermo-electric material is a material that includes Zn and Sb. An example of a material that includes Zn and Sb material is the binary $Zn_xSb_y$ phase. The binary $Zn_xSb_y$ phase has a very low thermal conductivity, $\lambda$, and, consequently, a high Z.

In another embodiment, the thermo-electric material utilized by the at least one of the plurality of thermo-electric plates 102 of thermo-electric generator module 100 is a doped $Zn_xSb_y$. $Zn_xSb_y$ can be doped with one or more materials, including Pb, Si, Ca, and La.

In further embodiment, a nanomaterial based on $Zn_xSb_y$ doped with one or more of Pb, Si, Ca, and La is the thermo-electric material utilized by the at least one of the plurality of thermo-electric plates 102 of thermo-electric generator module 100. A thermo-electric nanomaterial based on $Zn_xSb_y$ doped with one or more of Pb, Si, Ca, and La is cost effective compared with expensive commercialized thermo-electrical materials, such as BiTe, SiGe, and the like.

The shape of the heat absorption member 104 of helps to establish a temperature gradient in the power recovery rod 400 between the heat absorption member 104 and the heat dissipation region 106. To facilitate establishment of the temperature gradient, the heat absorption member 104 has a shape sufficient to trap heat and/or light without allowing the heat and/or light to reflect out from the heat absorption member 104.

According to an embodiment, the heat absorption 104 member includes a cavity. According to an embodiment, the cavity is a U-shaped chamber, which facilitates confinement of the heat and/or light. In another embodiment, the U-shaped chamber has a neck at an opening (for example at the top) with a shape that substantially prevents heat and/or light from escaping through the opening of the chamber.

Trapping heat and/or light within the chamber facilitates radiation of heat energy through the thermo-electric generator for conversion to electric energy. The cavity can have any shape that facilitates confinement of the heat energy within the cavity and/or facilitates radiation of heat energy through the thermo-electric generator for conversion to electric energy. Example shapes of the cavity include a U shape, a gourd shape, and the like.

When used herein, the term "gourd shape" refers to a shape similar to a gourd fruit. In an embodiment, a gourd-shaped cavity has at least two distinct neck regions, one at the cavity opening and at least one at another point in the cavity. The neck regions of the gourd-shaped cavity have a shape that substantially prevents heat and/or light from escaping through the opening of the chamber.

In an embodiment, the cavity is a gourd-shaped cavity. The gourd-shaped cavity helps to trap heat and/or light within the heat absorption region. In other words, the gourd-shaped cavity facilitates confinement of heat energy within the gourd-shaped cavity, reducing heat loss in the power recovery rod 400. By reducing heat loss, the gourd-shaped cavity facilitates radiation of heat energy only through the power recovery rod 400 for energy conversion, which increases efficiency of the power recovery rod 400.

The power recovery rod 400 includes a connector 402 and a lens 404 in addition to the plurality of thermo-electric plates 102 on the surface of a heat absorption member 104 and encased by the heat dissipating region 106.

The lens 404 facilitates focusing heat energy (or light) into the power recovery rod 400. The lens focuses heat and/or light into the heat absorbing member 104 to facilitate establishment of a temperature gradient. In an embodiment, the lens 404 facilitates conversion of heat energy to electric energy by the power recovery rod 400 by magnifying the heat and/or light directed to the power recovery rod 400.

The connector 402 includes a conductive material that facilitates the conduction of electricity. Examples of conductive materials include metals, such as copper.

Figure 5:
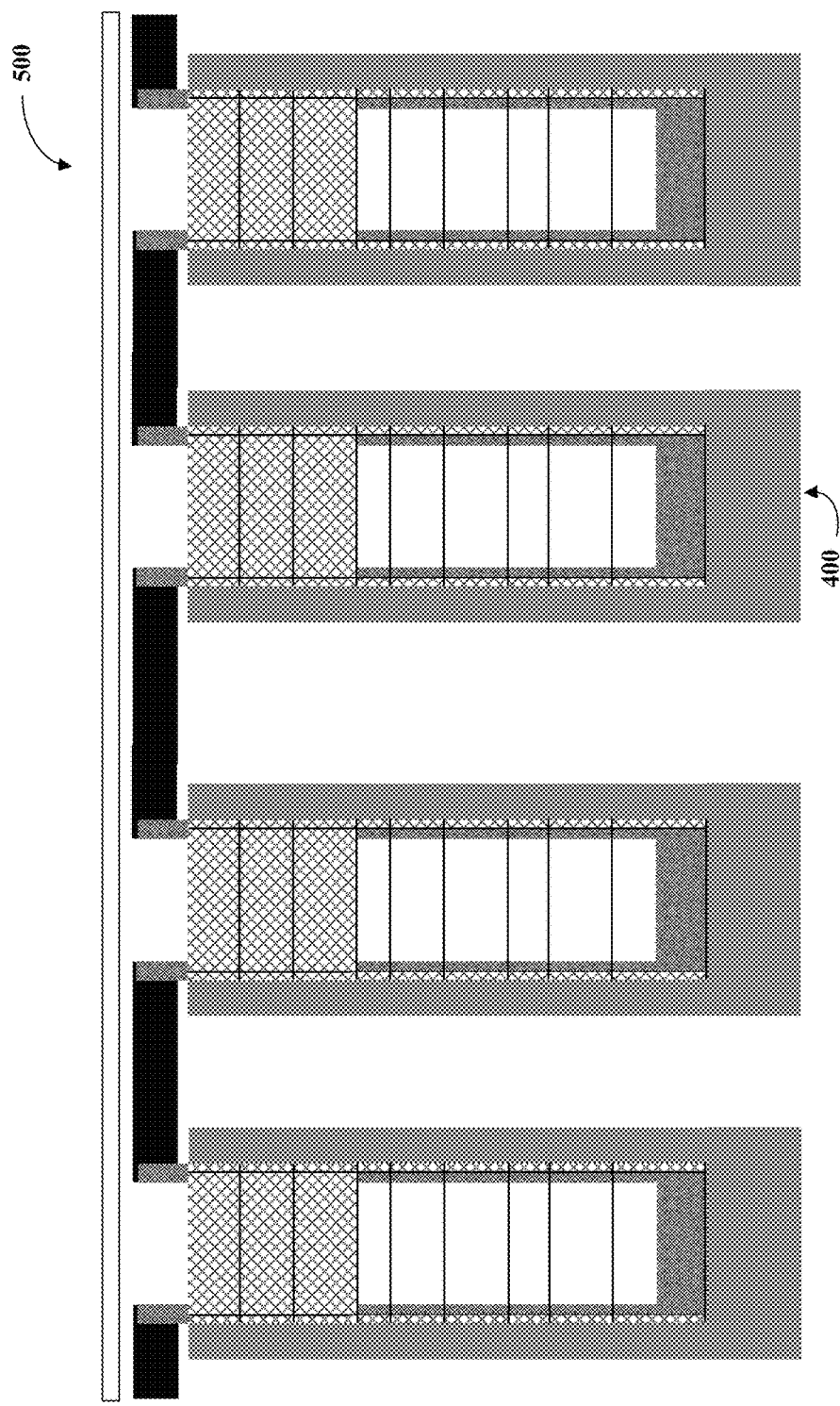
FIG. 5 is a schematic illustration of a series of thermo-electric generator modules, according to a non-limiting embodiment.

In an embodiment, the connector 402 is mounted to the heat absorption member 102. A heat absorption member from another power recovery rod can also be attached to the connector 402. The power recovery rod 400 can be arranged in a series 500 of thermo-electric generator modules as illustrated in FIG. 5. Although FIG. 5 illustrates a single lens spread across the series, it will be understood that more than one lens can be used.

The series 500 is a thermo-electric series that includes a plurality of thermo-electric generator modules 400 (or thermo-electric modules 100). At least one of the plurality of thermo-electric generator modules 400 includes at least a heat absorption member 104, a plurality of thermo-electric plates 102 on a surface of the heat absorption member 104, and a heat dissipation region that encases the heat absorption member. In an embodiment, the series 500 can include about one-hundred thermo-electric modules or more and can occupy an area less than or equal to about one square meter.

Figure 6:
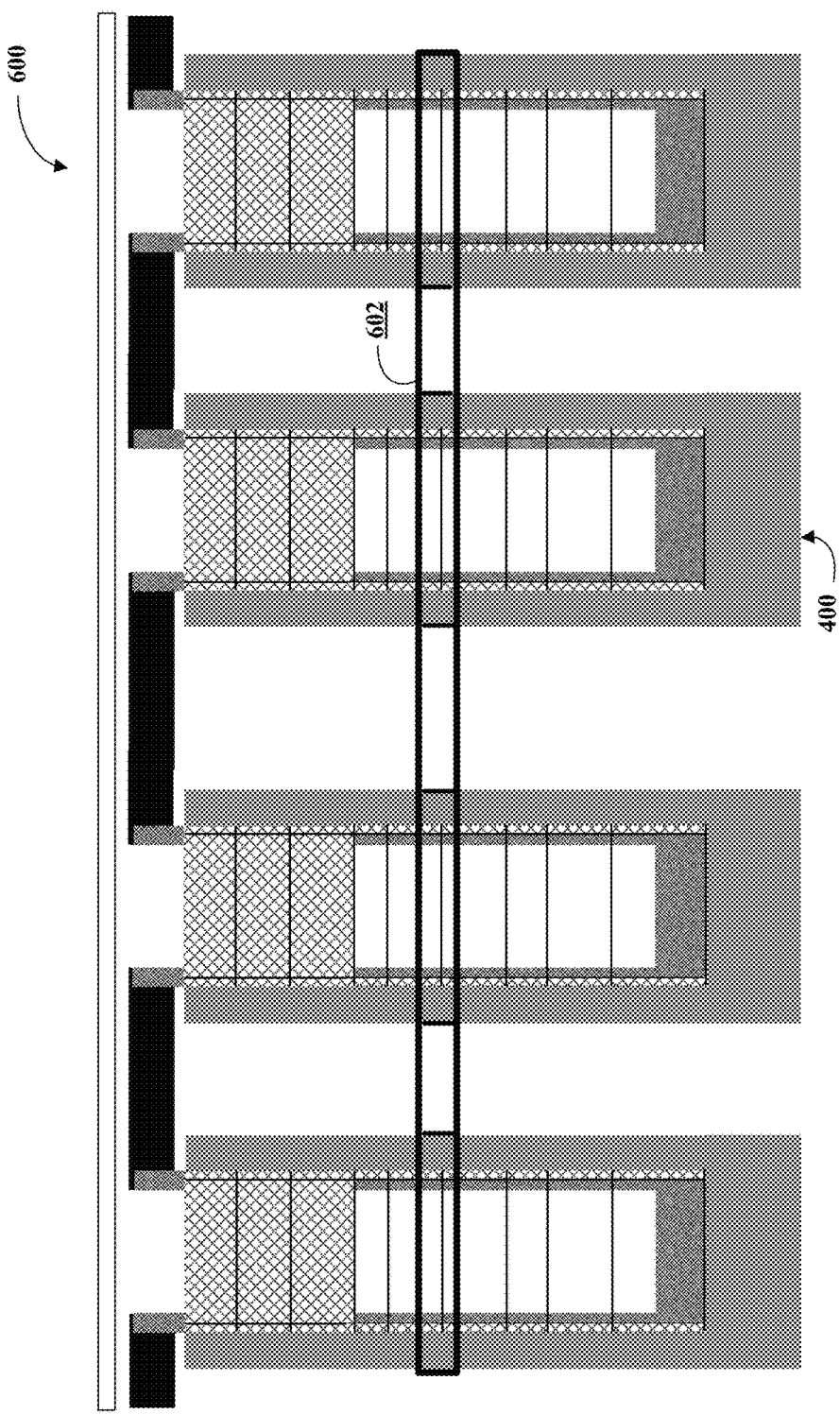
FIG. 6 is a schematic illustration of a series of thermo-electric generator modules in a mounting frame, according to a non-limiting embodiment.

Referring now to FIG. 6, illustrated is a series 600 of power recovery rods 400 in a mounting frame, according to a non-limiting embodiment. Although a series 600 of power recovery rods 400 is illustrated, it will be understood that thermo-electric generator modules 100 can also be arranged in the series. According to an embodiment, the series is assembled by inserting the power recovery rods 400 into a mounting frame 602. The power recovery rods 400 can be inserted into the mounting frame 602 one by one. In an embodiment, the series 600 of power recovery rods 400 can be placed in a cooling mechanism, such as a fluid coolant. The cooling mechanism further facilitates development of the temperature gradient between the heat dissipation region 106 and the heat absorption member 104.

Figure 7:
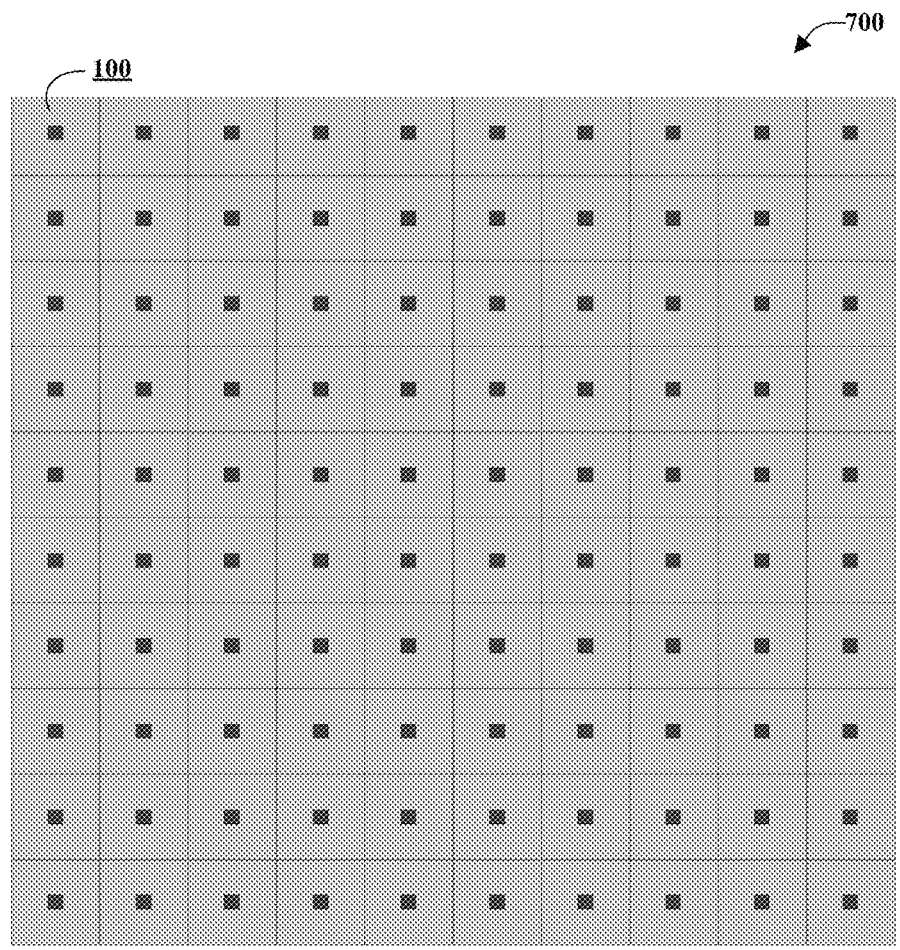
FIG. 7 is a schematic illustration of an array of thermo-electric generator modules, according to a non-limiting embodiment.

The thermo-electric generator modules 100 (or power recovery rods 400) can be assembled into an array 700. FIG. 7 is a schematic illustration of an array 600 of thermo-electric generator modules 100, according to a non-limiting embodiment. The array 600, according to an embodiment, can be a series of thermo-electric generator modules 100 arranged to fit in a space with an area less than or equal to one square meter. In an embodiment, the array 600 can include about 100 or more thermo-electric generator models that fit in a space with an area less than or equal to one square meter. The array 700 can facilitate generation of electric power on the order of kilowatts in an area on the order of one square meter.

Figure 8:
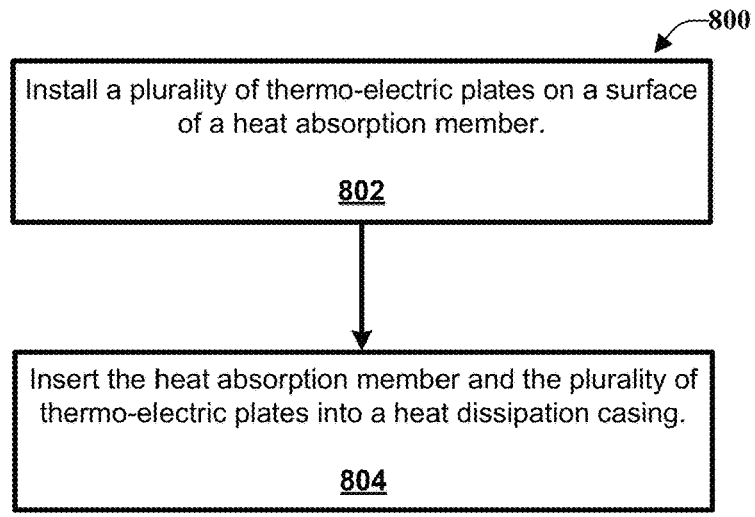
FIG. 8 is a process flow diagram of a method for constructing a thermo-electric generator module, according to a non-limiting embodiment.
Figure 9:
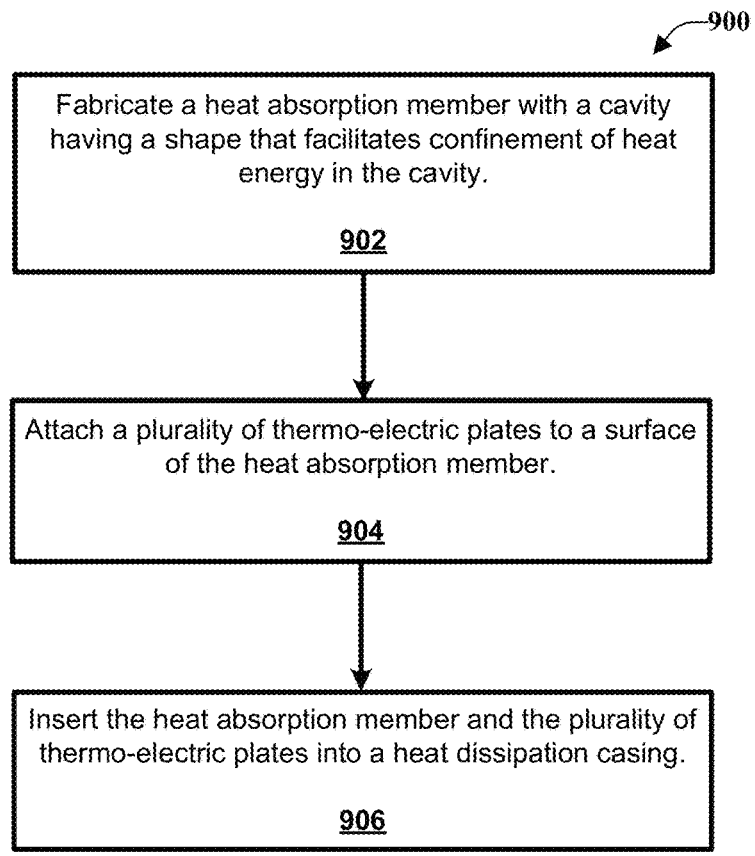
FIG. 9 is a process flow diagram of a method for constructing a thermo-electric generator module with a heat absorption member with a cavity, according to a non-limiting embodiment.
Figure 10:
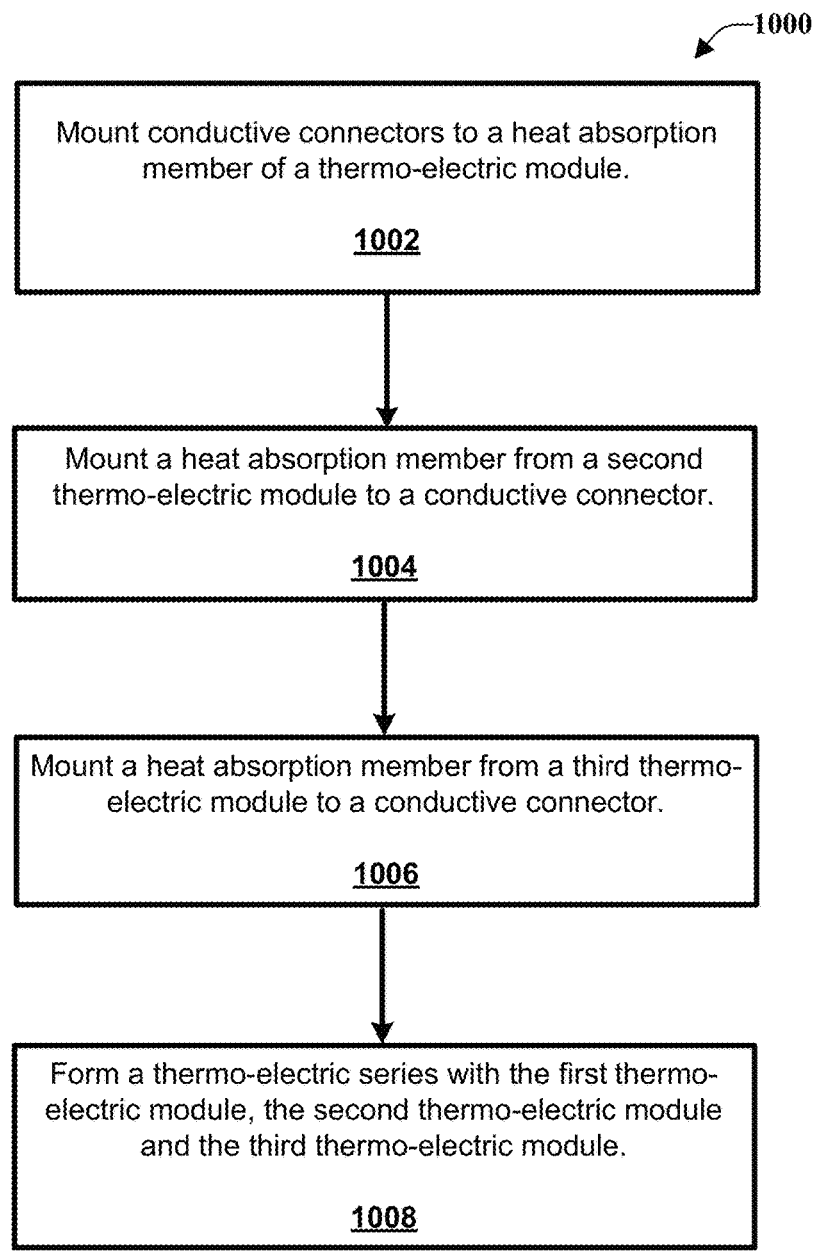
FIG. 10 is a process flow diagram of a method for forming a thermo-electric series, according to a non-limiting embodiment.

FIGS. 8-10 illustrate methods and/or flow diagrams in accordance with embodiments of this disclosure. For simplicity of explanation, the methods are depicted and described as a series of acts. However, acts in accordance with this disclosure can occur in various orders and/or concurrently, and with other acts not presented and described in this disclosure. Furthermore, not all illustrated acts may be required to implement the methods in accordance with the disclosed subject matter. In addition, those skilled in the art will understand and appreciate that the methods could alternatively be represented as a series of interrelated states via a state diagram or events.

Referring now to FIG. 8, illustrated is a process flow diagram of a method for constructing a thermo-electric generator module, according to a non-limiting embodiment. At element 802, a plurality of thermo-electric plates are installed on a surface of a heat absorption member. At element 804, the heat absorption member and the plurality of thermo-electric plates are inserted into a heat dissipation casing to form the thermo-electric generator module.

The heat dissipation region is a heat dissipation casing made from at least one heat dissipation material that facilitates the dissipation of heat. The heat absorption member is made from at least one heat absorption material that facilitates the absorption of heat.

One or more thermo-electric plates can be located on each surface of the heat absorption member (e.g., if the heat absorption member has four surfaces, one or more thermo-electric plates are located in each of the four surfaces). In an embodiment, the thermoelectric plates are arranged in an array of thermoelectric plates, which can facilitate the generation of electric energy. In an embodiment, the array of thermo-electric plates can include forty or more thermo-electric plates.

At least one of the one or more thermo-electric plates are made of a "good" thermo-electric material. Examples of "good" thermo-electric materials that can be used in at least one of the thermo-electric plates 102 include: $Bi_aTe_b$, $Co_cSb_d$, $Zn_x Sb_y$, $Bi_ePb_fTe_g$, and the like. It will be understood that a, b, c, d, x, y, e, f and g can be any number, bound only by the rules for conservation of charge.

According to an embodiment, the "good" thermo-electric material is a material that includes Zn and Sb. An example of a material that includes Zn and Sb material is the binary $Zn_x Sb_y$ phase. The binary $Zn_xSb_y$ phase has a very low thermal conductivity, $\lambda$, and, consequently, a high Z.

In another embodiment, the thermo-electric material utilized by the at least one of the plurality of thermo-electric plates of thermo-electric generator module is a doped $Zn_x Sb_y$. $Zn_x Sb_y$ can be doped with one or more materials, including Pb, Si, Ca, and La.

In further embodiment, a nanomaterial based on $Zn_xSb_y$ doped with one or more of Pb, Si, Ca, and La is the thermo-electric material utilized by the at least one of the plurality of thermo-electric plates of thermo-electric generator module 100. A thermo-electric nanomaterial based on $Zn_xSb_y$ doped with one or more of Pb, Si, Ca, and La is cost effective compared with expensive commercialized thermoelectrical materials, such as BiTe, SiGe, and the like.

Referring now to FIG. 9, illustrated is a process flow diagram of a method 900 for constructing a thermo-electric generator module with a heat absorption member with a cavity, according to a non-limiting embodiment. At element 902, a heat absorption member with a cavity having a shape that facilitates confinement of heat energy in the cavity is fabricated.

The heat absorption member helps to establish the temperature gradient in the thermo-electric generator module between the heat absorption member and the heat dissipation region. To facilitate establishment of the temperature gradient, the heat absorption member has a shape sufficient to trap heat and/or light without allowing the heat and/or light to reflect out from the heat absorption member.

According to an embodiment, the heat absorption member includes a cavity. According to an embodiment, the cavity is a U-shaped chamber, which facilitates confinement of the heat and/or light. In another embodiment, the U-shaped chamber has a neck at an opening (for example at the top) with a shape that substantially prevents heat and/or light from escaping through the opening of the chamber.

Trapping heat and/or light within the chamber facilitates radiation of heat energy through the thermo-electric generator for conversion to electric energy. The cavity can have any shape that facilitates confinement of the heat energy within the cavity and/or facilitates radiation of heat energy through the thermo-electric generator for conversion to electric energy. Example shapes of the cavity include a U shape, a gourd shape, and the like.

In an embodiment, the cavity is a gourd-shaped cavity. The gourd-shaped cavity helps to trap heat and/or light within the heat absorption region. In other words, the gourd-shaped cavity facilitates confinement of heat energy within the gourd-shaped cavity. By confining heat energy within the gourd-shaped cavity, the gourd-shaped cavity reduces heat loss in thermo-electric generator module 100. By reducing heat loss, the gourd-shaped cavity facilitates radiation of heat energy only through the thermo-electric generator module for energy conversion, which increases efficiency of the thermo-electric generator module.

At element 904, a plurality of thermo-electric plates are attached to a surface of the heat absorption member. The thermo-electric plates include solid-state semiconductor materials. In an embodiment, the thermo-electric plates are Peltier plates. At element 906, the heat absorption member and the plurality of thermo-electric plates are inserted into a heat dissipation casing.

Referring now to FIG. 10, illustrated is a process flow diagram of a method 1000 for forming a thermo-electric series, according to a non-limiting embodiment. At element 1002, conductive connectors are mounted to a heat absorption member of a thermo-electric module. According to an embodiment, the thermo-electric module includes a plurality of thermo-electric plates on a surface of a heat absorption member and a heat dissipation region that encases the heat absorption member. In an embodiment, at least two conductive connectors are mounted to the heat-absorption member.

At element 1004, a heat absorption member from a second thermo-electric module is mounted to one of the conductive connectors. At element a heat absorption member from a third thermo-electric module is mounted to another one of the conductive connectors. At element 1006, a thermo-electric series is formed with the first thermo-electric module, the second thermo-electric module and the third thermo-electric module.

What has been described above includes examples of the embodiments of the subject disclosure. It is, of course, not possible to describe every conceivable combination of components or methods for purposes of describing the claimed subject matter, but it is to be appreciated that many further combinations and permutations of the various embodiments are possible. Accordingly, the claimed subject matter is intended to embrace all such alterations, modifications, and variations that fall within the spirit and scope of the appended claims. While specific embodiments and examples are described in this disclosure for illustrative purposes, various modifications are possible that are considered within the scope of such embodiments and examples, as those skilled in the relevant art can recognize.

In addition, the words "example" or "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. An apparatus, comprising:
   a mounting frame comprising slots;
   a set of power recovery rods, wherein each power recovery rod of the set of the power recovery rods is inserted into a distinct slot of the mounting frame; and
   a single lens overlying all of the power recovery rods of the set of the power recovery rods;
   wherein each power recovery rod of the set comprises:
      a heat absorption channel comprising a heat absorption member and a plurality of thermo-electric plates, wherein the plurality of thermo-electric plates are located on a surface of the heat absorption member, and wherein the heat absorption member comprises a cavity, a base, and an opening located opposite to the base of the heat absorption member,
      wherein the single lens is located adjacent to the opening,
      a heat dissipation region that encases the heat absorption channel, and
      a pair of copper connector elements mounted to a top of the heat absorption member and adjacent to the opening, wherein the pair of copper connector elements are interposed between the single lens and the heat dissipation region; and
   wherein the single lens magnifies light energy to an area comprising all of respective openings of heat absorption members of the power recovery rods and at least a portion of the magnified light energy enters respective cavities of the heat absorption members.

2. The apparatus of claim 1, wherein the cavity has a shape that facilitates confinement of heat energy.

3. The apparatus of claim 1, wherein the cavity has a shape that facilitates a radiation of heat energy through the heat absorption channel for conversion to electric energy.

4. The apparatus of claim 1, wherein the heat absorption member and the heat dissipation region establish a temperature gradient to facilitate a confinement of heat energy.

5. The apparatus of claim 1, wherein the cavity has a gourd shape.

6. The apparatus of claim 1, wherein the apparatus is encased within a cooling element comprising a cooling fluid to facilitate a formation of a temperature gradient between the heat dissipation region and the heat absorption member.

7. The apparatus of claim 1, wherein at least one of the plurality of thermo-electric plates comprises an n-type semiconductor and a p-type semiconductor electrically connected in series.

8. The apparatus of claim 1, wherein the power recovery rods are arranged in an array.

9. A device, comprising:
   a mounting frame comprising a plurality of slots;
   a plurality of thermo-electric modules, wherein each thermo-electric module of the plurality of thermo-electric modules is inserted into a different slot of the plurality of slots of the mounting frame; and
   a single lens overlying all thermo-electric modules of the plurality of thermo-electric modules;
   wherein each thermo-electric module of the plurality of thermo-electric modules comprises:

a heat absorption member comprising a cavity, a base, and an opening across from the base of the heat absorption member, a plurality of thermo-electric plates on a surface of the heat absorption member, wherein the single lens is located proximate to the opening, a heat dissipation region that encases the heat absorption member, and a pair of copper connector elements mounted to a top of the heat absorption member and adjacent to the one opening, wherein the copper connector elements are interposed between the single lens and the heat dissipation region; and wherein the single lens magnifies light energy to an area covering all of openings of heat absorption members of the plurality of the thermo-electric modules and at least a portion of the magnified light energy enters respective cavities of the heat absorption members.

10. The device of claim 9, wherein the plurality of thermo-electric modules comprises one-hundred thermo-electric modules.

11. The device of claim 10, wherein the thermo-electric modules occupy an area of less than or equal to about one square meter.

12. The device of claim 9, wherein the cavity has a gourd shape.

13. The apparatus of claim 1, wherein the heat dissipation region facilitates a dissipation of heat based on a temperature gradient between the heat dissipation region and the heat absorption member.

14. The apparatus of claim 1, wherein a thermo-electric plate of the plurality of thermo-electric plates comprises a first material and a second material connected in series.

15. The apparatus of claim 1, wherein the apparatus is hermetically sealed.

16. The apparatus of claim 9, wherein the at least one of the plurality of thermo-electric modules is hermetically sealed.

* * * * *